United States Patent [19]

Schurig

[11] Patent Number: 4,898,791
[45] Date of Patent: Feb. 6, 1990

[54] SOLDERABLE LAYER SYSTEM

[75] Inventor: Dieter Schurig, Wallrabenstein, Fed. Rep. of Germany

[73] Assignee: VDO Adolf Schindling AG, Frankfurt am Main, Fed. Rep. of Germany

[21] Appl. No.: 152,620

[22] Filed: Feb. 5, 1988

[30] Foreign Application Priority Data

Feb. 19, 1987 [DE] Fed. Rep. of Germany ....... 3705258

[51] Int. Cl.$^4$ .................................. B32B 15/04
[52] U.S. Cl. ................... 428/629; 428/632; 428/647
[58] Field of Search .............. 428/620, 632, 642, 647, 428/674, 629; 420/477

[56]  References Cited

U.S. PATENT DOCUMENTS

| 4,424,408 | 1/1984 | Elarde | 174/68.5 |
| 4,441,118 | 4/1984 | Fister et al. | 357/70 |
| 4,511,634 | 4/1985 | Nickol | 428/647 |
| 4,758,474 | 7/1988 | Tsukamoto | 428/629 |

FOREIGN PATENT DOCUMENTS 170444 2/1986 European Pat. Off. .

OTHER PUBLICATIONS

Hook, "The Welding of Copper and Its Alloys", Welding Research Supplement, Jul. 1955, pp. 321–337.

Primary Examiner—Robert McDowell
Attorney, Agent, or Firm—Martin A. Farber

[57] ABSTRACT

In a solderable layer system in which a conductor layer which is partially covered with a layer of solder is applied to a support, the solder layer consists of an alloy in which a reducing agent is contained. The alloy is preferably brass.

6 Claims, 1 Drawing Sheet

SOLDERABLE LAYER SYSTEM

FIELD AND BACKGROUND OF THE INVENTION

The present invention relates to a solderable layer system in which a conductor layer which is partially covered by a layer of solder is applied to a support.

In electrical circuits and components, materials which in themselves are not solderable are frequently used for conductive paths. In order nevertheless to provide these conductive paths with solder points it is known to apply a solder layer to such conductor layers. Frequently, an intermediate layer is further applied as coupling agent in order to improve the adherence of the layer of solder to the conductor layer. Finally, in known layer systems a corrosion layer is also applied over the solder layer, for a different reason, in order to permit temporary storage of the parts provided with the solder layer until the soldering is effected.

Such layer systems require a considerable expense for their manufacture. Furthermore, the action of the coupling agent frequently is reduced by aging processes in the known layer systems.

SUMMARY OF THE INVENTION

It is an object of the present invention to provide a solderable layer system which is as simple and stable as possible.

Accordingly, the layer system of the invention is characterized by the fact that the solder layer (7) consists of an alloy within which a reducing agent is contained.

The layer system of the invention can be manufactured economically by simple methods and is extremely resistant to aging.

In a further development of the invention, the reducing agent is zinc.

In that case the alloy can be brass.

It is advantageous for the reducing agent to be diffused at least in part, into the boundary layers (8, 9) of the solder layer (7). This can be effected by the action of heat on the solder layer after the application to the conductor layer. A diffusion of the reducing agent into the outer regions of the solder layer however takes place even upon subsequent increases in temperature, for instance upon the soldering process, so that a continuation of the diffusion process used with the invention then takes place. The adherence between the conductor layer and the solder layer, explained in detail with reference to the illustrative embodiment, will therefore not be reduced by subsequent action of heat but, on the contrary, increased.

BRIEF DESCRIPTION OF THE DRAWING

With the above and other objects and advantages in view, the present invention will become more clearly understood in connection with the detailed description of a preferred embodiment when considered with the accompanying drawing, of which.

Identical parts are provided with identical reference numbers in the figures. The layer systems are shown in each case in sectional views in the figures, the thickness of the layers being greatly exaggerated.

DETAILED DESCRIPTION OF THE PREFERRED EMBODIMENT

Figure 1:
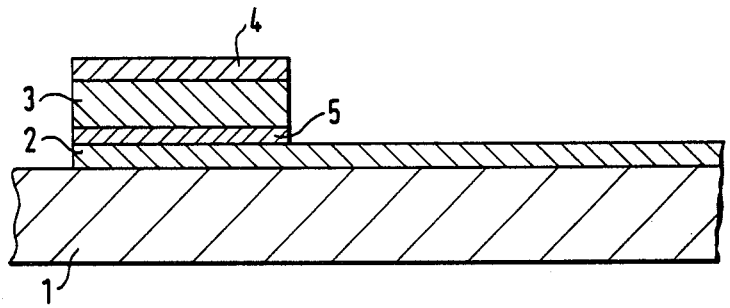
FIG. 1 is a cross-sectional view of a known layer system.

In the known layer system, a conductor layer 2 which consists, for instance, of indium-tin-oxide (ITO) and is part of a liquid crystal cell is applied to the support 1. In order to permit a solder connection to electronic components, for instance to so-called chip modules, the conductor layer 2 is provided with a solder layer 3 at a suitable place. Metals such as copper or iron are suitable for this. The solder layer 3 is covered by a corrosion layer 4 which consists, for instance, of gold, silicon, tin or indium. In order to improve the adherence between the solder layer 3 and the conductor layer 2, a layer of coupling agent 5 is provided. Chromium, titanium or aluminum, among others, is suitable for this.

As can be readily noted from the layer construction, several process steps are necessary for the production of this layer system. This leads to an increase in the cost of the components provided with the layer system.

Furthermore, the solder diffuses into the solder layer. If the solder layer reaches the region of the boundary between solder layer, coupling-agent layer and conductor layer then the adhesive between the solder layer and the conductor layer decreases greatly. In order to assure a permanent connection, relatively thick solder layers are therefore necessary in the known layer systems.

Figure 2:
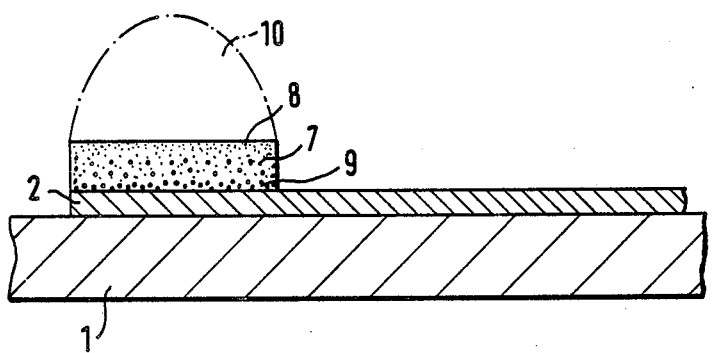
FIG. 2 is a cross-sectional view of a layer system according to the invention.

In the layer system of the invention which is shown in FIG. 2, a solder layer 7 of brass is applied to the conductor layer 2. Upon increased temperature, the zinc contained in the brass diffuses into the boundary surfaces of the solder layer 7. At the upper surface 8 of the solder layer 7 the zinc oxidizes and thus forms a corrosion layer. The portion of the zinc which has diffused to the boundary layer 9 to the conductor layer reacts with the portion of tin in the conductor layer 2, which consists, for instance, of indium-tin-oxide. In this way the atom layers of the tin-oxide which are near the interface are reduced to metallic tin, which then serves as coupling agent between the conductor layer 2 and the solder layer 7. The solder 10 which is applied subsequently is shown in dashed line in FIG. 2.

In contradistinction to the known layer system shown in FIG. 1, solder which diffuses through the solder layer 7 does not act negatively on the bond. On the contrary, the bond can even be strengthened since the solder comes against a metallic intermediate layer. The solder layer 7 can therefore be made substantially thinner than the known solder layer 2 (FIG. 1). A dependable tinning need merely be assured.

The layer system of the invention also has advantages with respect to the soldering process. Since the corrosion protection layer which has been produced by the diffusion of the zinc atoms to the surface of the solder layer 7 is of extremely slight thickness, there is also only a slight loss of material upon the removal of the corrosion protection layer before the soldering.

It is noted that brass is a well-known alloy of copper and zinc. The percentages of zinc normally provided in the formation of brass are adequate for the practice of the invention.

I claim:

1. In a solderable layer system in which a conductor layer, which is partially covered by a layer of solder, is applied to a support, the improvement wherein:

said conductive layer is disposed between and contiguous said support and layer of solder, said conductive layer being formed of a material which includes an oxide of tin;

said system includes a reducing agent; and the solder layer comprises an alloy, brass, which includes said reducing agent, said reducing agent being operative with said oxide to free the tin for improved adherence between the solder layer and the conductive layer.

2. A system according to claim 1, wherein:

the reducing agent is zinc.

3. In a solderable layer system in which a conductor layer, which is partially covered by a layer of solder, is applied to a support, the improvement wherein said conductive layer is disposed between and contiguous said support and layer of solder, said conductive layer being formed of a material which includes an oxide of tin;

said system includes zinc which serves as a reducing agent;

the solder layer is made of an alloy which includes said reducing agent, said reducing agent being operative with said metal oxide to free the tin for improved adherence between the solder layer and the conductive layer; and wherein:

the alloy is brass, and the material of said conductive layer is indium-tin-oxide.

4. A system according to claim 1, wherein:

said conductor layer is contacted by a bottom surface of the solder layer, there being an upper surface of the solder layer in contact with air of an external environment; and wherein:

the reducing agent is diffused at least partially into boundary layers at the upper and bottom surfaces of the solder layer.

5. In a solderable layer system in which a conductor layer, which is partially covered by a layer of solder, is applied to a support, the improvement wherein:

said conductive layer is dispersed between and contiguous said support and layer of solder, said conductive layer being formed of a material which includes an oxide of tin; and the solder layer is made of brass, there being zinc in the brass, the zinc being operative with said oxide to free the tin for improved adherence between the solder layer and the conductive layer.

6. In a solderable layer system in which a conductor layer, which is partially covered by a layer of solder, is applied to a support, the improvement wherein said conductive layer is disposed between and contiguous said support and layer of solder, said conductive layer being formed of a material which includes an oxide of tin;

said system includes zinc as a reducing agent; and the solder layer comprises an alloy, brass, which includes said zinc, said zinc being operative with said tin oxide to free the tin for improved adherence between the solder layer and the conductive layer.

* * * * *